(12) United States Patent
Noguchi et al.

(10) Patent No.: US 11,204,368 B2
(45) Date of Patent: Dec. 21, 2021

(54) INSPECTION DEVICE

(71) Applicant: YOKOWO CO., LTD., Tokyo (JP)

(72) Inventors: Masaki Noguchi, Tomioka (JP); Takahiro Nagata, Tomioka (JP); Tsuyoshi Yamato, Tomioka (JP)

(73) Assignee: Yokowo Co., Ltd., Tokyo (JP)

( * ) Notice: Subject to any disclaimer, the term of this patent is extended or adjusted under 35 U.S.C. 154(b) by 48 days.

(21) Appl. No.: 16/811,453

(22) Filed: Mar. 6, 2020

(65) Prior Publication Data

US 2020/0300889 A1    Sep. 24, 2020

(30) Foreign Application Priority Data

Mar. 22, 2019 (JP) .............................. JP2019-055503

(51) Int. Cl.
| | |
|---|---|
| *G01R 1/04* | (2006.01) |
| *G01R 1/067* | (2006.01) |
| *G01R 1/073* | (2006.01) |
| *G01R 29/08* | (2006.01) |

(52) U.S. Cl.
CPC ......... *G01R 1/0416* (2013.01); *G01R 1/0466* (2013.01); *G01R 1/0491* (2013.01); *G01R 1/06705* (2013.01); *G01R 1/07328* (2013.01); *G01R 29/08* (2013.01)

(58) Field of Classification Search
CPC .......................... G01R 1/0416; G01R 1/0466; G01R 1/06705; G01R 1/07328
See application file for complete search history.

(56) References Cited

U.S. PATENT DOCUMENTS

| | | | | |
|---|---|---|---|---|
| 4,707,656 A | * | 11/1987 | Marzan | G01R 31/2886 324/537 |
| 2008/0139009 A1 | * | 6/2008 | Suzuki | G01R 1/0416 439/63 |
| 2018/0196096 A1 | | 7/2018 | Jeong et al. | |

FOREIGN PATENT DOCUMENTS

| | | |
|---|---|---|
| JP | 2007-085801 A | 4/2007 |
| JP | 2018-529951 A | 10/2018 |

* cited by examiner

*Primary Examiner* — Paresh Patel
(74) *Attorney, Agent, or Firm* — Morgan, Lewis & Bockius LLP

(57) ABSTRACT

A first signal line pattern has one end electrically connected to a first connector. A second signal line pattern has one end electrically connected to a second connector. The second signal line pattern has the other end facing the other end of the first signal line pattern. A conductive block has a convex portion. The convex portion of the conductive block is electrically connected to a third portion of the conductive pattern positioned between the other end of the first signal line pattern and the other end of the second signal line pattern of the wiring board.

8 Claims, 9 Drawing Sheets

INSPECTION DEVICE

This application is based on Japanese patent application NO. 2019-55503, the content of which is incorporated hereinto by reference.

BACKGROUND

Technical Field

The invention relates to an inspection device.

Related Art

In recent years, for example, as described in Japanese Unexamined Patent Publication No. 2007-85801, an inspection device that inspects an electronic component such as a radio frequency device (for example, a surface acoustic wave (SAW) filter) has been developed. The inspection device includes a wiring board in which a transmission path is formed. A terminal of the electronic component is electrically connected to the transmission path of the wiring board.

PCT Japanese Translation Patent Publication No. 2018-529951 describes an example of an inspection socket that is used to inspect an electronic component (for example, an integrated circuit (IC)). The inspection socket has a conductive noise shielding body and a plurality of signal probes. Each signal probe is inserted into a hole formed in the noise shielding body. Both ends of each signal probe are exposed from the noise shielding body. The noise shielding body has a noise shielding wall between one end of one signal probe and one end of an adjacent signal probe.

SUMMARY

The inspection device to inspect the electronic component may be requested to accurately inspect a band-pass property of the electronic component with the electronic component mounted on a conductive or resin block (for example, a metal socket) mounted on the wiring board. For example, in Japanese Unexamined Patent Publication No. 2007-85801, there is no description that a conductive or resin block is mounted on the wiring board. In PCT Japanese Translation Patent Publication No. 2018-529951, there is no description of how each signal probe of the noise shielding body is connected to the wiring board.

An example of an object of the invention is to accurately inspect a band-pass property of an electronic component. Other objects of the invention will become apparent from the description of the specification.

One aspect of the invention is an inspection device to inspect an electronic component. The inspection device includes a wiring board and an inspection socket. The wiring board includes a first signal line pattern having one end electrically connected to a first connector, a second signal line pattern having one end electrically connected to a second connector and the other end facing the other end of the first signal line pattern, and a conductive pattern having first portions positioned at both sides of the first signal line pattern, second portions positioned at both sides of the second signal line pattern, and a third portion positioned between the other end of the first signal line pattern and the other end of the second signal line pattern. The inspection socket includes a conductive block positioned over the wiring board and mounted with the electronic component, a first signal probe inserted into a first hole formed in the conductive block and electrically connecting the first signal line pattern of the wiring board to a first signal terminal of the electronic component, a second signal probe inserted into a second hole formed in the conductive block and electrically connecting the second signal line pattern of the wiring board to a second signal terminal of the electronic component, and a ground probe inserted into a ground hole formed in the conductive block and electrically connecting the conductive pattern of the wiring board to a ground terminal of the electronic component. The conductive block includes a convex portion electrically connected to the third portion of the conductive pattern.

According to one embodiment of the invention, it is possible to accurately inspect a band-pass property of an electronic component.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
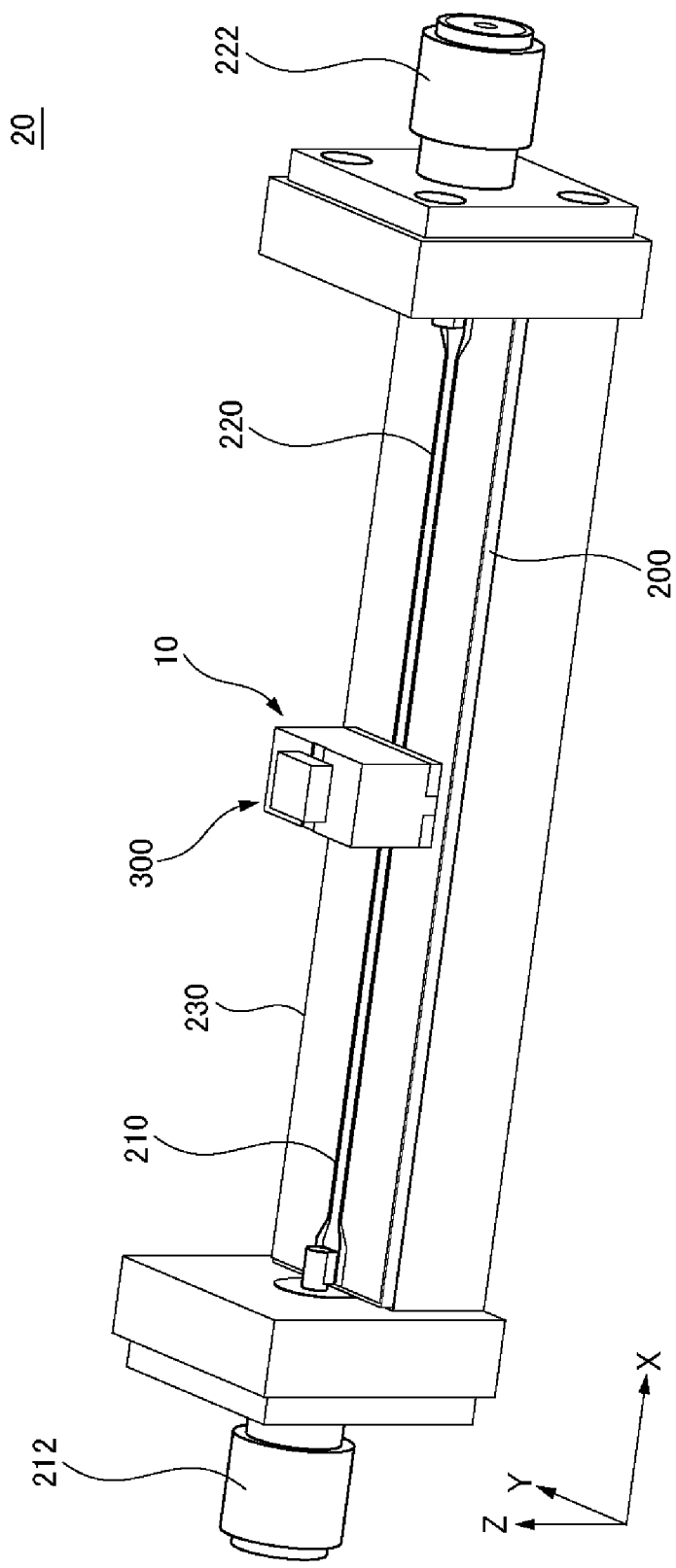
FIG. 1 is a perspective view of an inspection device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, an embodiment of the invention will be described referring to the drawings. In all drawings, the same constituent elements are represented by the same reference numerals, and description thereof will not be repeated.

Figure 2:
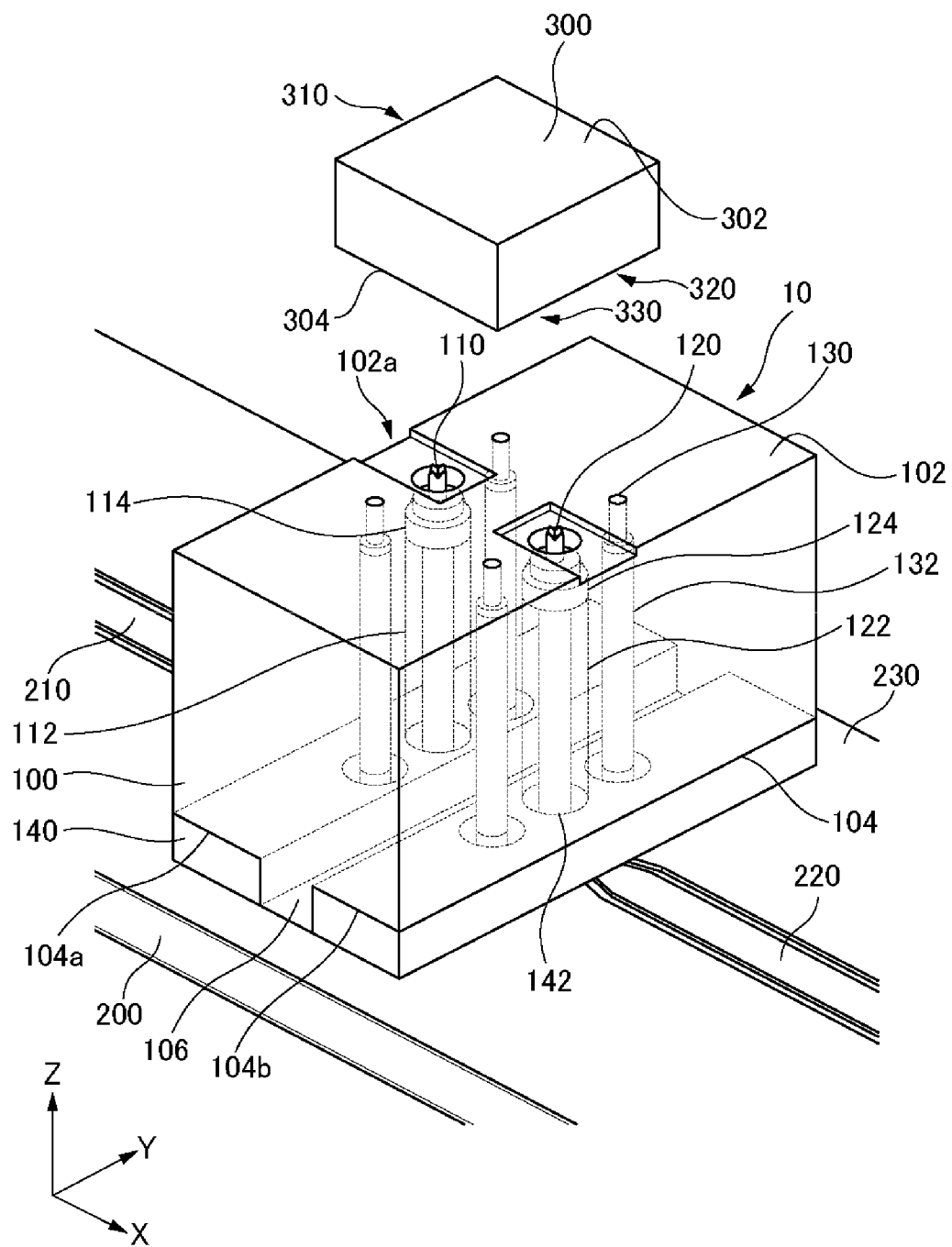
FIG. 2 is an enlarged view of an inspection socket shown in FIG. 1.
Figure 3:
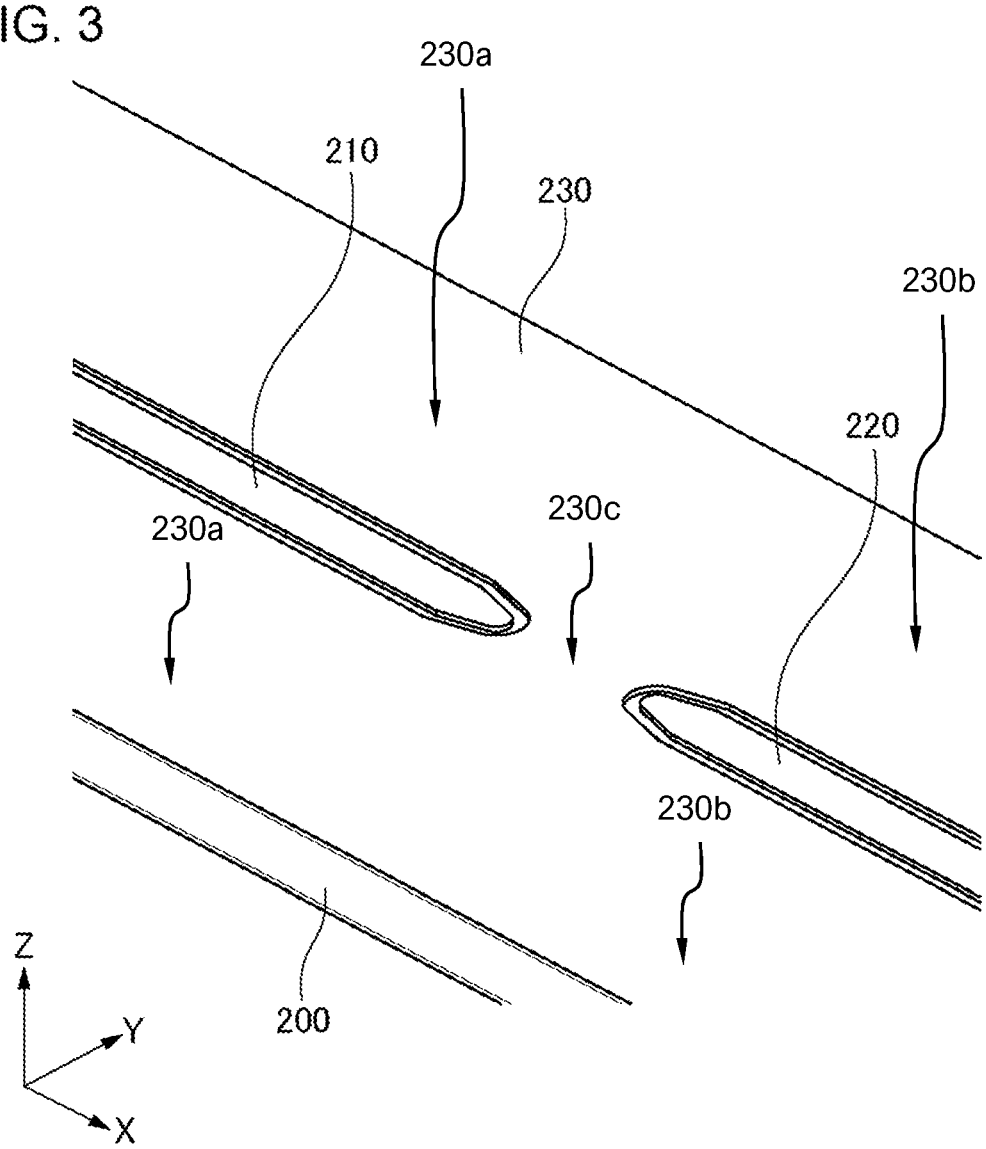
FIG. 3 is a diagram with the inspection socket removed from FIG. 2.

FIG. 1 is a perspective view of an inspection device 20 according to the embodiment. FIG. 2 is an enlarged view of an inspection socket 10 shown in FIG. 1. In FIG. 2, the structure in the conductive block 100 is drawn by dotted lines. FIG. 3 is a diagram with the inspection socket 10 removed from FIG. 2. In FIGS. 1 to 3, the X direction indicates a lengthwise direction of the inspection device 20 (in particular, a wiring board 200), the Y direction indicates a width direction of the inspection device 20 (in particular, the wiring board 200), and the Z direction indicates a height direction of the inspection device 20.

The outline of the inspection device 20 will be described referring to FIGS. 1 to 3. The inspection device 20 is a device that inspects an electronic component 300. The inspection device 20 includes the inspection socket 10, the wiring board 200, a first connector 212, and a second connector 222. The wiring board 200 has a first signal line pattern 210, a second signal line pattern 220, and a conductive pattern 230. The first signal line pattern 210 has one end electrically connected to the first connector 212. The second signal line pattern 220 has one end electrically connected to the second connector 222. The second signal line pattern 220 has the other end facing the other end of the first signal line pattern 210. The conductive pattern 230 includes first portions 230a positioned at both sides of the first signal line pattern 210 in the Y direction, second portions 230b positioned at both sides of the second signal line pattern 220 in the Y direction, and a third portion 230c positioned between the other end of the first signal line pattern 210 and the other end of the second signal line pattern 220. The inspection socket 10 has a conductive block 100, a first signal probe 110, a second signal probe 120, ground probes 130, and dielectric members 140. The conductive block 100 is positioned over the wiring board 200. The electronic component 300 is mounted over the conductive block 100. The first signal probe 110 is inserted into a first hole 112 formed in the conductive block 100 and electrically connects the first signal line pattern 210 of the wiring board 200 to a first signal terminal 310 of the electronic component 300. The second signal probe 120 is inserted into a second hole 122 formed in the conductive block 100 and electrically connects the second signal line pattern 220 of the wiring board 200 to a second signal terminal 320 of the electronic component 300. The ground probes 130 are inserted into ground holes 132 formed in the conductive block 100 and electrically connect the conductive pattern 230 of the wiring board 200 to a ground terminal 330 of the electronic component 300. The conductive block 100 includes a convex portion 106 that protrudes in the Z direction. The convex portion 106 of the conductive block 100 is electrically connected to the third portion 230c of the conductive pattern 230 positioned between the other end of the first signal line pattern 210 of the wiring board 200 and the other end of the second signal line pattern 220 of the wiring board 200.

According to the embodiment, it is possible to accurately inspect a band-pass property of the electronic component 300. Specifically, in a case where the convex portion 106 of the conductive block 100 is absent, the amount of electrical coupling between the first signal line pattern 210 and the second signal line pattern 220 of the wiring board 200 could increase, and the inspection device 20 could be affected (for example, intensity of a signal in a cutoff band could be high in the inspection of the electronic component 300 using the inspection device 20). In contrast, in the embodiment, the amount of electrical coupling between the first signal line pattern 210 and the second signal line pattern 220 is suppressed to an amount capable of inspecting a band-pass property of an electronic component due to the convex portion 106 of the conductive block 100. Accordingly, it is possible to accurately inspect the band-pass property of the electronic component 300.

The details of the wiring board 200 will be described referring to FIGS. 1 to 3.

The first signal line pattern 210, the second signal line pattern 220, and the conductive pattern 230 are physically spaced apart from one another.

In the example shown in FIGS. 1 to 3, the wiring board 200 extends in one direction (the X direction in FIG. 1). Each of the first signal line pattern 210 and the second signal line pattern 220 extends in the one direction and is arranged in the one direction. As described above, the conductive pattern 230 includes portions positioned at both sides of the first signal line pattern 210 in the Y direction, portions positioned at both sides of the second signal line pattern 220 in the Y direction, and a portion positioned between the other end of the first signal line pattern 210 and the other end of the second signal line pattern 220. It should be noted that the shapes of the first signal line pattern 210, the second signal line pattern 220, and the conductive pattern 230 are not limited to the example shown in FIGS. 1 to 3.

The first signal line pattern 210, the second signal line pattern 220, and the conductive pattern 230 are formed of a conductor. The conductor is, for example, metal (for example, copper).

The first connector 212 is attached to one end of the wiring board 200, and the second connector 222 is attached to the other end of the wiring board 200. The first connector 212 is electrically connected to the first signal line pattern 210, and the second connector 222 is electrically connected to the second signal line pattern 220. The first connector 212 and the second connector 222 are connected to measurement equipment (not shown). Each of the first connector 212 and the second connector 222 is, for example, a coaxial connector.

The details of the inspection socket 10 will be described referring to FIGS. 1 to 3.

The conductive block 100 includes a first surface 102 (upper surface) and a second surface 104 (lower surface). The electronic component 300 is mounted over the first surface 102 of the conductive block 100. The second surface 104 of the conductive block 100 is opposite to the first surface 102 in the Z direction. The second surface 104 includes a first region 104a and a second region 104b. The convex portion 106 protrudes toward the opposite side of the first surface 102 between the first region 104a and the second region 104b. The width of the convex portion 106 in the X direction (FIG. 1) may be wide. The wider the width of the convex portion 106 in the X direction (FIG. 1) is, the less the amount of electrical coupling between the first signal line pattern 210 and the second signal line pattern 220 of the wiring board 200 is, due to the convex portion 106.

The conductive block 100 is, for example, a metal block, and more specifically, can be, for example, a gold-plated brass block.

The first signal probe 110 is inserted into the first hole 112 formed in the conductive block 100 from the first region 104a of the second surface 104 to a portion of the first surface 102 opposite to the first region 104a in the Z direction. In addition, the first signal probe 110 is held by an insulator 114 embedded in the first hole 112. The first signal probe 110 and the first hole 112 have a coaxial structure. One end (lower end) of the first signal probe 110 is connected to the first signal line pattern 210 of the wiring board 200, and the other end (upper end) of the first signal probe 110 is connected to the first signal terminal 310 of the electronic component 300. Specifically, one end (lower end) of the first signal probe 110 can be in contact with the first signal line pattern 210 of the wiring board 200, and the other end (upper end) of the first signal probe 110 can be in contact with the first signal terminal 310 of the electronic component 300. The first signal probe 110 includes an elastic body (for example, a spring) that elastically moves at least one of both ends of the first signal probe 110.

The second signal probe 120 is inserted into the second hole 122 formed in the conductive block 100 from the second region 104b of the second surface 104 to a portion of the first surface 102 opposite to the second region 104b in the Z direction. In addition, the second signal probe 120 is held by an insulator 124 embedded in the second hole 122. The second signal probe 120 and the second hole 122 have a coaxial structure. One end (lower end) of the second signal probe 120 is connected to the second signal line pattern 220 of the wiring board 200, and the other end (upper end) of the second signal probe 120 is connected to the second signal terminal 320 of the electronic component 300. Specifically, one end (lower end) of the second signal probe 120 can be in contact with the second signal line pattern 220 of the wiring board 200, and the other end (upper end) of the second signal probe 120 can be in contact with the second signal terminal 320 of the electronic component 300. The second signal probe 120 includes an elastic body (for example, a spring) that elastically moves at least one of both ends of the second signal probe 120.

Two concave portions 102a are formed at the first surface 102 (upper surface) side of the conductive block 100. One end (upper end) of the first signal probe 110 protrudes from a bottom surface of one concave portion 102a, and one end (upper end) of the second signal probe 120 protrudes from a bottom surface of the other concave portion 102a. In this way, it is possible to restrain the first signal terminal 310 and the second signal terminal 320 of the electronic component 300 from being short-circuited to the conductive block 100. The arrangement of the concave portions 102a is not limited to the example shown in FIG. 2. For example, the two concave portions 102a shown in FIG. 2 may be connected to each other. In addition, one end (upper end) of only one of the first signal probe 110 and the second signal probe 120 may protrude from the concave portion 102a.

In the example shown in FIG. 2, each of a plurality of ground probes 130 is inserted into each of a plurality of ground holes 132 formed in the conductive block 100. In particular, in the example shown in FIG. 2, two ground probes 130 are positioned at both sides of the first signal probe 110, and two additional ground probes 130 are positioned at both sides of the second signal probe 120. It should be noted that the arrangement of the ground probes 130 is not limited to the example shown in FIG. 2. One end of each ground probe 130 is connected to the conductive pattern 230 of the wiring board 200, and the other end of the ground probe 130 is connected to the ground terminal 330 of the electronic component 300. Specifically, one end of the ground probe 130 can be in contact with the conductive pattern 230 of the wiring board 200, and the other end of the ground probe 130 can be in contact with the ground terminal 330 of the electronic component 300. An outer surface of the ground probe 130 may be in contact with an inner surface of the ground hole 132. The ground probe 130 includes an elastic body (for example, a spring) that elastically moves at least one of both ends of the ground probe 130.

In the example of FIG. 2, two dielectric members 140 are arranged at both sides of the convex portion 106 of the conductive block 100. Each of the first signal probe 110 and the two ground probes 130 at both sides of the first signal probe 110 is inserted into each of three holding holes 142 formed in one dielectric member 140. Each of the second signal probe 120 and the two ground probes 130 at both sides of the second signal probe 120 is inserted into each of three holding holes 142 formed in the other dielectric member 140. It is possible to hold the conductive block 100 with the dielectric members 140. The dielectric members 140 are formed of, for example, industrial plastic.

The arrangement of the dielectric members 140 is not limited to the example shown in FIG. 2. For example, the two dielectric members 140 shown in FIG. 2 may be connected to each other. In this case, the convex portion 106 of the conductive block 100 enters a gap between one portion and the other portion of the single dielectric member 140 spaced apart from each other.

Figure 4:
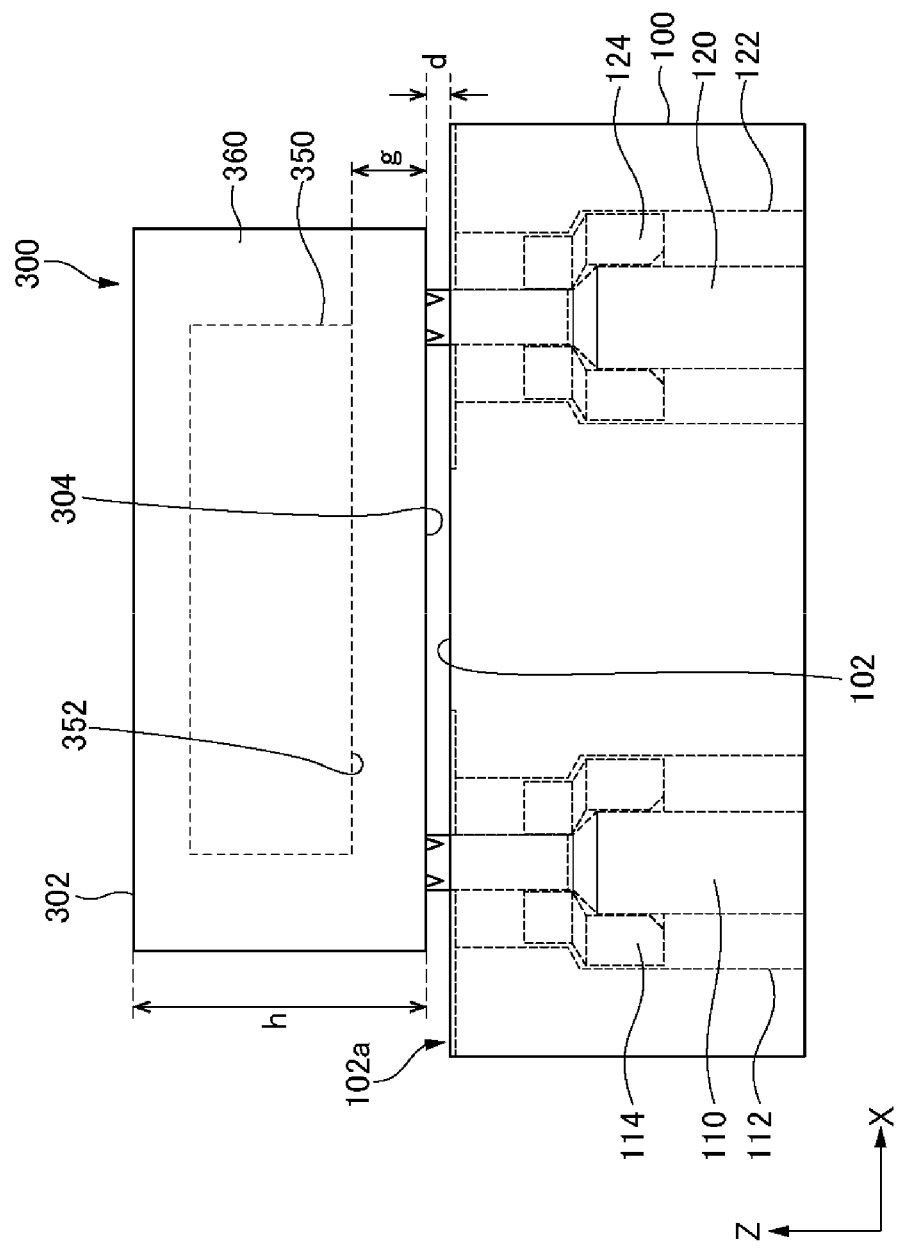
FIG. 4 is a diagram illustrating an example of a method of mounting an electronic component over a conductive block.

FIG. 4 is a diagram illustrating an example of a method of mounting the electronic component 300 over the conductive block 100. In FIG. 4, the structure in the conductive block 100 and the structure in the electronic component 300 are drawn by dotted lines.

The electronic component 300 has a third surface 302 and a fourth surface 304. In the example shown in FIG. 4, the electronic component 300 has a substantially rectangular parallelepiped shape. The fourth surface 304 is opposite to the third surface 302 in the Z direction. The electronic component 300 has a height h between the third surface 302 and the fourth surface 304.

The electronic component 300 has a die 350 and a package 360. The die 350 is positioned inside the package 360. The die 350 includes a bottom surface 352. The bottom surface 352 of the die 350 faces the first surface 102 of the conductive block 100. The bottom surface 352 of the die 350 is spaced apart from the fourth surface 304 of the electronic component 300 (package 360) by a distance g.

The first surface 102 of the conductive block 100 faces the fourth surface 304 of the electronic component 300 by a distance d. In the example shown in FIG. 4, a region between the first surface 102 of the conductive block 100 and the fourth surface 304 of the electronic component 300 has a void.

The distance d is, for example, equal to or greater than 0, preferably, exceeds 0, and is, for example, equal to or less than ($\frac{1}{2}$)h, preferably, equal to or less than ($\frac{1}{4}$)h. As will be described below in detail, the smaller the distance d between the first surface 102 of the conductive block 100 and the fourth surface 304 of the electronic component 300 is, the closer an attenuation property to a band-pass property of a single electronic component to be measured in the inspection of the electronic component 300 using the inspection device 20 can be obtained. This is presumably because electrical coupling between signal lines (for example, electrical coupling between the first signal probe 110 and the second signal probe 120) is reduced in a case where the distance d is small.

For example, the distance d may be smaller than the distance g between the fourth surface 304 of the electronic component 300 (package 360) and the bottom surface 352 of the die 350. Even in this case, it is possible to obtain an attenuation property close to the band-pass property of the single electronic component to be measured by reducing intensity of a signal in the inspection of the electronic component 300 using the inspection device 20.

Figure 5:
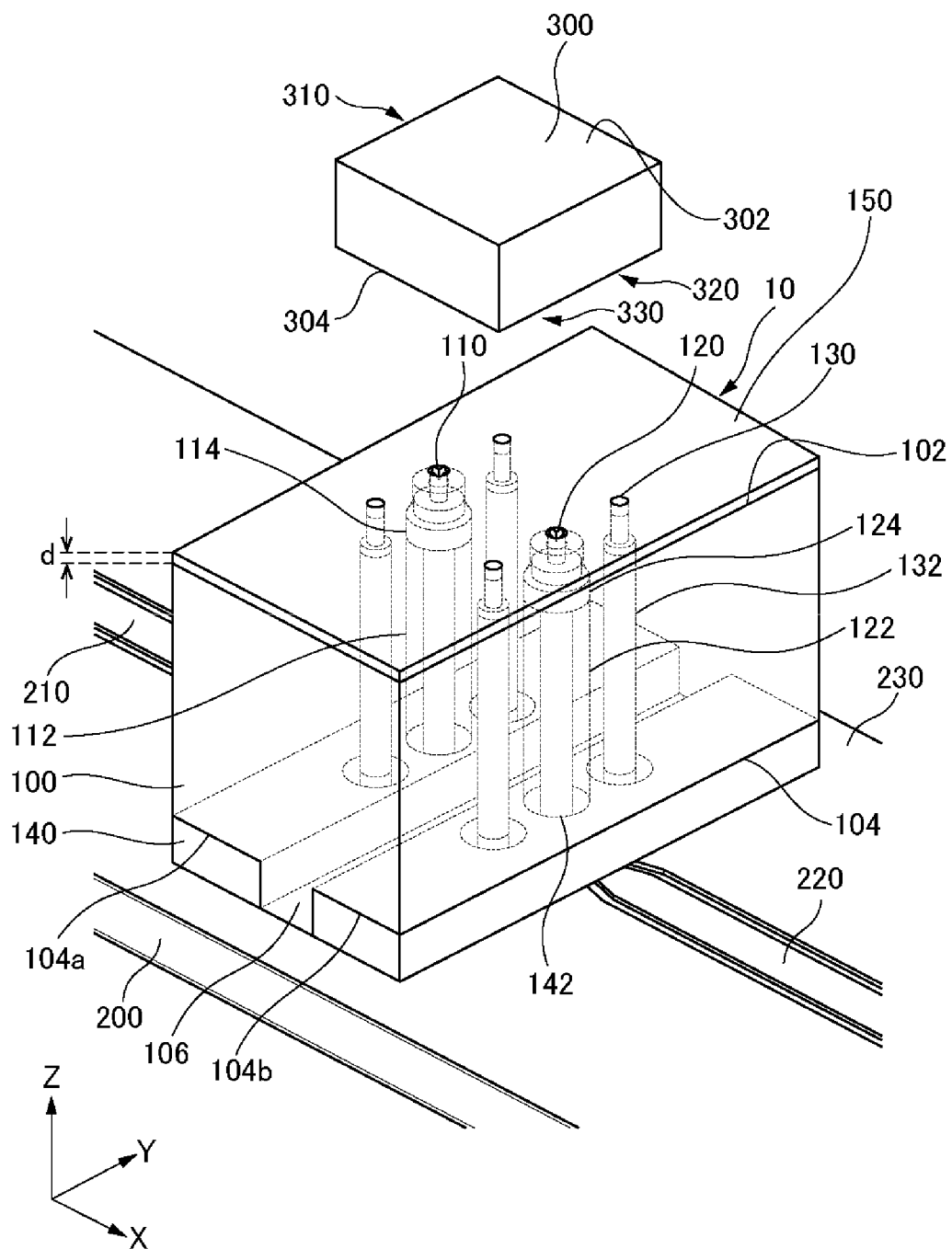
FIG. 5 is a diagram showing a modification example of FIG. 4.

FIG. 5 is a diagram showing a modification example of FIG. 4. In FIG. 5, the structure in the conductive block 100 is drawn by dotted lines.

The region between the first surface 102 of the conductive block 100 and the fourth surface 304 of the electronic component 300 may not be a void, and the inspection socket 10 may have an insulating sheet 150 positioned between the first surface 102 of the conductive block 100 and the fourth surface 304 of the electronic component 300. The insulating sheet 150 is, for example, a resin sheet. The insulating sheet 150 has, for example, a distance d (thickness). That is, the distance d between the first surface 102 of the conductive block 100 and the fourth surface 304 of the electronic component 300 can be adjusted by adjusting the thickness of the insulating sheet 150. In addition, physical damage due to contact of the conductive block 100 and the electronic component 300 can be restrained by providing the insulating sheet 150 between the conductive block 100 and the electronic component 300.

Figure 6:
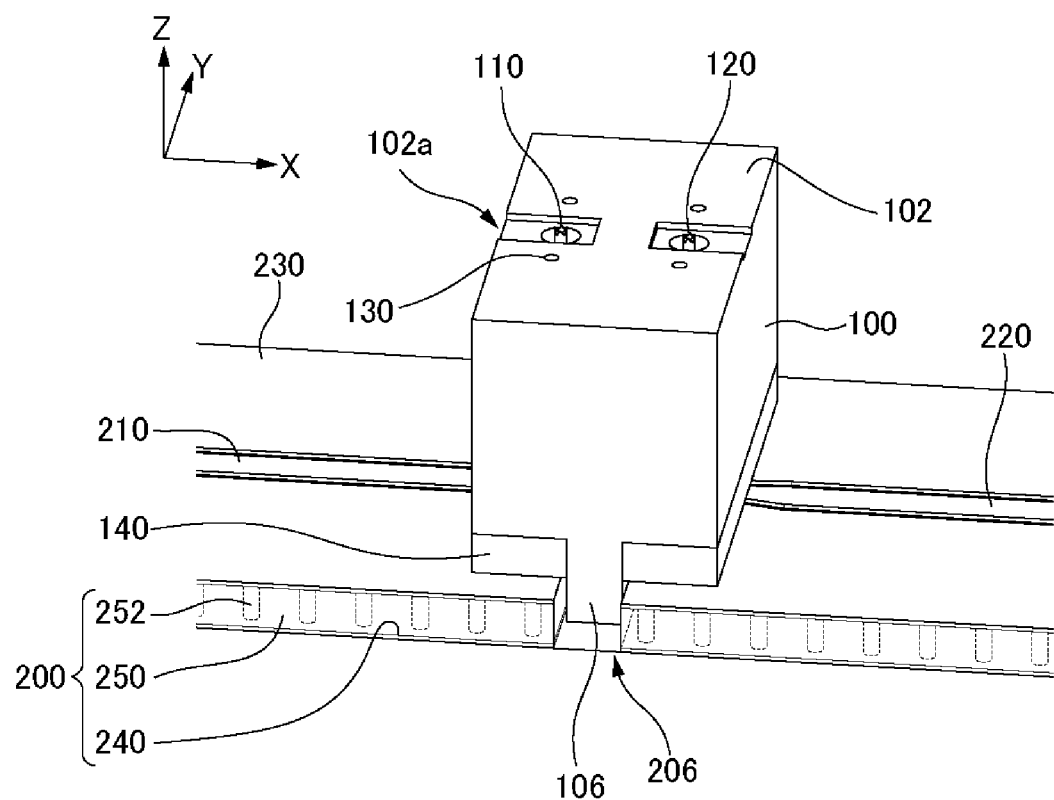
FIG. 6 is a diagram showing a modification example of FIG. 2.

FIG. 6 is a diagram showing a modification example of FIG. 2.

In the wiring board 200, a holding portion 206 having a recessed shape is formed. The convex portion 106 of the conductive block 100 enters the holding portion 206 of the wiring board 200. Accordingly, it is possible to hold the conductive block 100 with the holding portion 206 of the wiring board 200. The wiring board 200 can hold the conductive block 100 more firmly than a case where the holding portion 206 is not formed in the wiring board 200.

In addition, in the example shown in FIG. 6, the wiring board 200 has a ground surface 240, an insulating layer 250, and vias 252. The ground surface 240 is electrically connected to the conductive pattern 230 through the vias 252 positioned inside the insulating layer 250. In addition, a part of the ground surface 240 is exposed from the holding portion 206. The convex portion 106 of the conductive block 100 is electrically connected to the ground surface 240. Specifically, the convex portion 106 is connected to a part (a portion exposed from the holding portion 206) of the ground surface 240 of the wiring board 200. In this way, the convex portion 106 of the conductive block 100 may be electrically connected to the conductive pattern 230.

Figure 7:
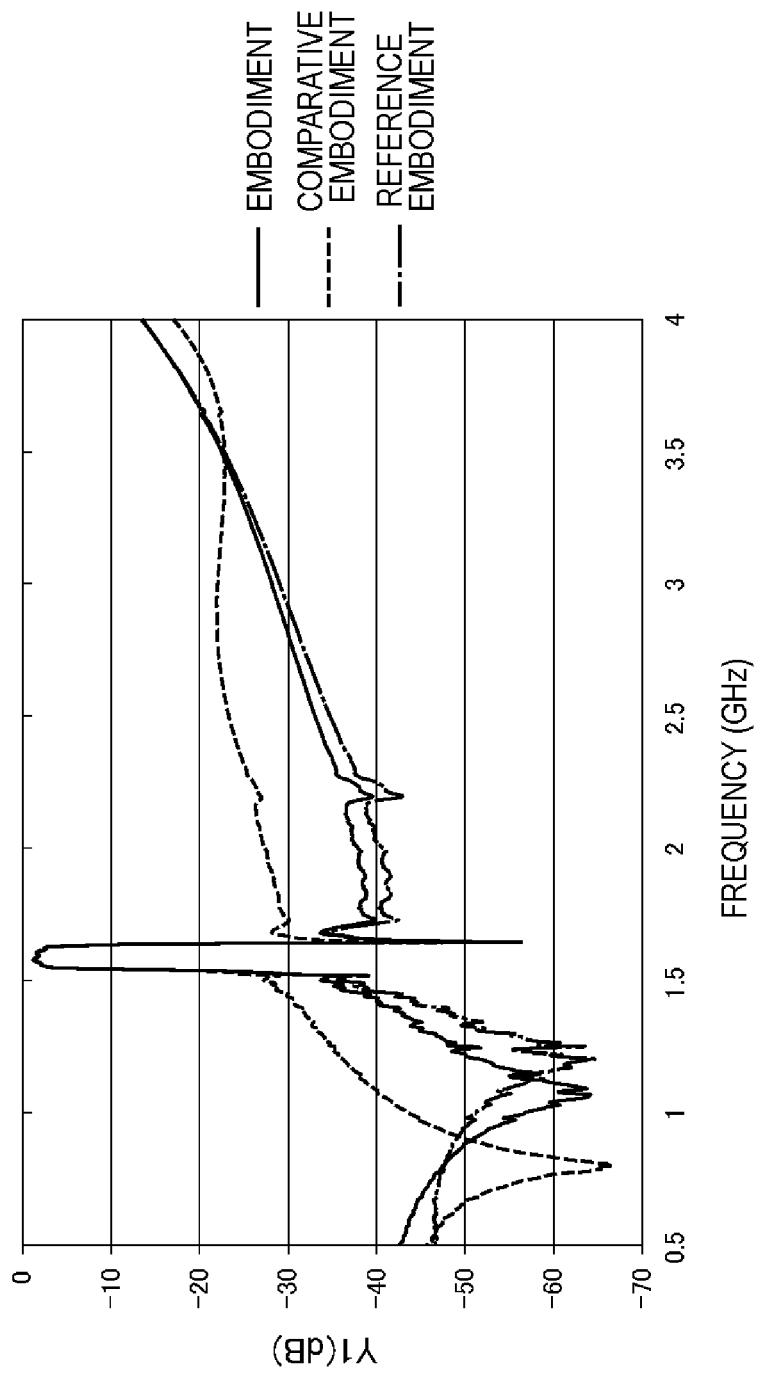
FIG. 7 is a graph showing frequency properties of each of the inspection device according to the embodiment, an inspection device according to a comparative embodiment, and an inspection device according to a reference embodiment.

FIG. 7 is a graph showing frequency property of each of the inspection device 20 according to the embodiment, an inspection device 20 according to a comparative embodiment, and an inspection device 20 according to a reference embodiment.

In the embodiment, the length of each of the first signal probe 110, the second signal probe 120, and the ground probes 130 was 4.9 mm. The distance d described referring to FIG. 4 was zero.

In the comparative embodiment, the convex portion 106 of the conductive block 100 was not provided. The length of each of the first signal probe 110, the second signal probe 120, and the ground probes 130 was 1.6 mm. The distance d described referring to FIG. 4 was 0.725 h.

In the reference embodiment, the inspection socket 10 was not provided, and the electronic component 300 was mounted directly on the wiring board 200.

As shown in FIG. 7, signal intensity of the embodiment is smaller than signal intensity of the comparative embodiment from about 1.00 GHz to 3.50 GHz without a peak of 1.60 GHz, and is close to signal intensity of the reference embodiment. The result suggests that reduction of coupling intensity between an input and an output of the inspection device 20 in a cutoff band in the inspection of the electronic component 300 using the inspection device 20 is implemented by providing the convex portion 106 of the conductive block 100 and decreasing the distance d.

Figure 8:
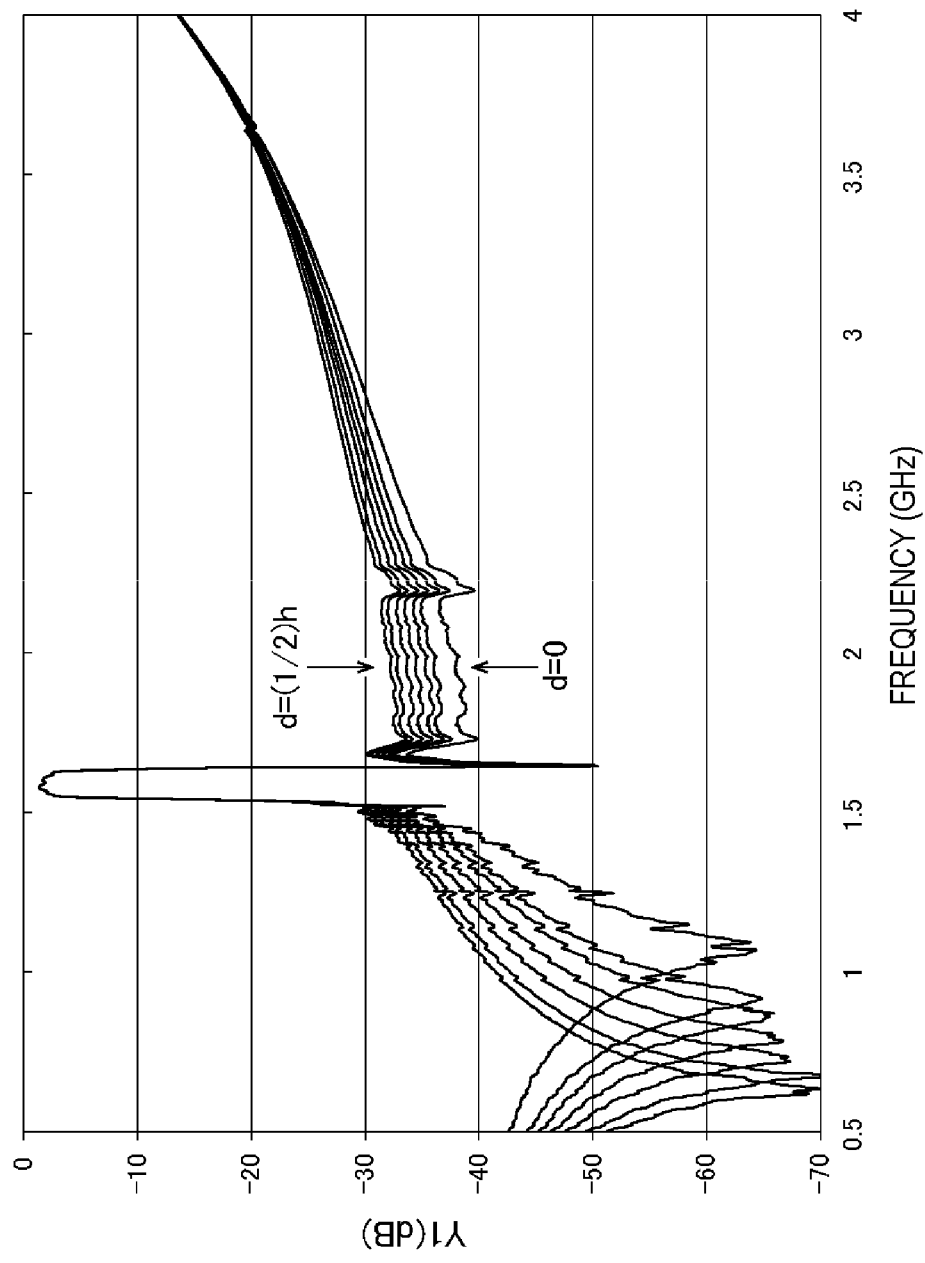
FIG. 8 is a graph showing frequency properties at different distances d on the inspection device according to the embodiment.

FIG. 8 is a graph showing frequency property at different distances d on the inspection device 20 according to the embodiment.

In the example shown in FIG. 8, signal intensity decreases in an order of $d=(1/2)h$, $d=(5/12)h$, $d=(1/3)h$, $d=(1/4)h$, $d=(1/6)h$, $d=(1/12)h$, and $d=0$ from about 1.00 GHz to 4.00 GHz without the peak of 1.60 GHz. The result suggests that the smaller the distance d is, the less the coupling intensity between the input and the output of the inspection device 20 in the cutoff band in the inspection of the electronic component 300 using the inspection device 20 is.

Figure 9:
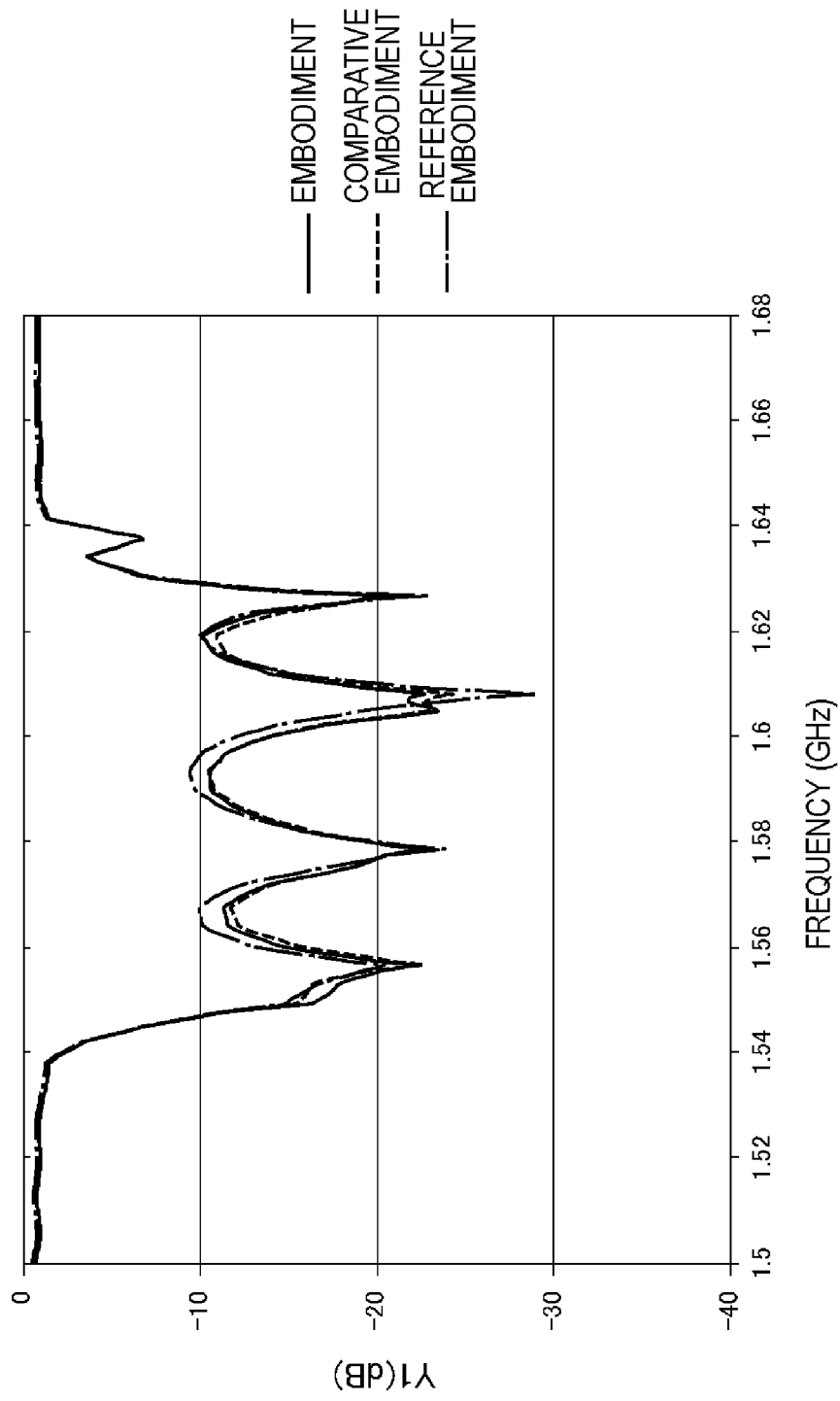
FIG. 9 is a graph showing reflection loss of each of the inspection device according to the embodiment, the inspection device according to the comparative embodiment, and the inspection device according to the reference embodiment.

FIG. 9 is a graph showing reflection loss of each of the inspection device 20 according to the embodiment, an inspection device 20 according to a comparative embodiment, and an inspection device 20 according to a reference embodiment. The embodiment, the comparative embodiment, and the reference embodiment of FIG. 9 are the same as the embodiment, the comparative embodiment, and the reference embodiment of FIG. 7, respectively.

As shown in FIG. 9, the reflection loss of the embodiment is almost the same as the reflection loss of the comparative embodiment and the reflection loss of the reference embodiment. As described above, each probe (the first signal probe 110, the second signal probe 120, and the ground probes 130) of the embodiment is longer than each probe in the comparative embodiment. The result shown in FIG. 9 suggests that impedance of a transmission line is kept with the coaxial structure of the first signal probe 110 and the first hole 112 and the coaxial structure of the second signal probe 120 and the second hole 122, regardless of the length of the probe.

Although the embodiment of the invention has been described above referring to the drawings, the embodiment is merely illustrative of the invention, and various configurations other than those described above can also be employed.

It is apparent that the invention is not limited to the above embodiment, and may be modified and changed without departing from the scope and spirit of the invention.

What is claimed is:

1. An inspection device to inspect an electronic component, the inspection device comprising:
    a wiring board including a first signal line pattern having one end electrically connected to a first connector, a second signal line pattern having one end electrically connected to a second connector and the other end facing the other end of the first signal line pattern, and a conductive pattern having first portions positioned at both sides of the first signal line pattern, second portions positioned at both sides of the second signal line pattern, and a third portion positioned between the other end of the first signal line pattern and the other end of the second signal line pattern; and
    an inspection socket including a conductive block positioned over the wiring board and mounted with the electronic component, a first signal probe inserted into a first hole formed in the conductive block and electrically connecting the first signal line pattern of the wiring board to a first signal terminal of the electronic component, a second signal probe inserted into a second hole formed in the conductive block and electrically connecting the second signal line pattern of the wiring board to a second signal terminal of the electronic component, and a ground probe inserted into a ground hole formed in the conductive block and electrically connecting the conductive pattern of the wiring board to a ground terminal of the electronic component,
    wherein the conductive block includes a convex portion electrically connected to the third portion of the conductive pattern.

2. The inspection device according to claim 1,
wherein the conductive block includes a first surface,
the electronic component includes a third surface and a fourth surface opposite to the third surface, and has a height h between the third surface and the fourth surface of the electronic component, and
the first surface of the conductive block faces the fourth surface of the electronic component by a distance d equal to or greater than 0 and equal to or less than (½)h.

3. The inspection device according to claim 1,
wherein the conductive block includes a first surface,
the electronic component has a fourth surface,
the electronic component has a package, and a die having a bottom surface facing the first surface of the conductive block and positioned inside the package, and
the first surface of the conductive block faces the fourth surface of the electronic component by a distance d smaller than a distance g between the fourth surface of the electronic component and the bottom surface of the die.

4. The inspection device according to claim 2,
wherein the inspection socket has an insulating sheet positioned between the first surface of the conductive block and the fourth surface of the electronic component.

5. The inspection device according to claim 1,
wherein the conductive block has at least one concave portion formed in a surface over which the electronic component is mounted, and
one end of at least one of the first signal probe and the second signal probe protrudes from a bottom surface of the at least one concave portion.

6. The inspection device according to claim 1,
wherein the wiring board has a holding portion, and
the convex portion of the conductive block enters the holding portion of the wiring board.

7. The inspection device according to claim 1,
wherein the wiring board has a ground surface, and
the convex portion is electrically connected to the ground surface.

8. The inspection device according to claim 1,
wherein the inspection socket has a dielectric member in which a holding hole into which at least one of the first signal probe and the second signal probe is inserted is formed.

* * * * *